(12) United States Patent
Sekiya

(10) Patent No.: US 9,048,349 B2
(45) Date of Patent: Jun. 2, 2015

(54) OPTICAL DEVICE WAFER PROCESSING METHOD

(75) Inventor: Kazuma Sekiya, Ota-Ku (JP)

(73) Assignee: Disco Corporation, Tokyo (JP)

( * ) Notice: Subject to any disclaimer, the term of this patent is extended or adjusted under 35 U.S.C. 154(b) by 220 days.

(21) Appl. No.: 13/309,066

(22) Filed: Dec. 1, 2011

(65) Prior Publication Data

US 2012/0156858 A1 Jun. 21, 2012

(30) Foreign Application Priority Data

Dec. 17, 2010 (JP) .................................. 2010-281705

(51) Int. Cl.
| | | |
|---|---|---|
| H01L 21/78 | (2006.01) | |
| H01L 33/00 | (2010.01) | |
| H01L 21/683 | (2006.01) | |
| B23K 26/00 | (2014.01) | |
| B23K 26/36 | (2014.01) | |
| B23K 26/40 | (2014.01) | |
| H01S 5/02 | (2006.01) | |
| H01S 5/323 | (2006.01) | |

(52) U.S. Cl.
CPC ... *H01L 33/0095* (2013.01); *H01L 2221/68327* (2013.01); *H01L 21/6836* (2013.01); *H01L 2221/68386* (2013.01); *H01L 21/78* (2013.01); *B23K 26/0063* (2013.01); *B23K 26/367* (2013.01); *B23K 26/4075* (2013.01); *B23K 26/409* (2013.01); *H01L 33/0079* (2013.01); *H01S 5/0213* (2013.01); *H01S 5/0217* (2013.01); *H01S 5/32341* (2013.01)

(58) Field of Classification Search
CPC ............... H01L 21/78–21/86; H01L 21/6835; H01L 21/6836; H01L 2221/68304–2221/68395
USPC ..................................................... 438/455–465
See application file for complete search history.

(56) References Cited

U.S. PATENT DOCUMENTS 6,426,275 B1 * 7/2002 Arisa ............................ 438/464
6,762,074 B1 * 7/2004 Draney et al. ................. 438/106
(Continued)

FOREIGN PATENT DOCUMENTS

| JP | 10-305420 | 11/1998 |
|---|---|---|
| JP | 2004-327708 | 11/2004 |

(Continued)

OTHER PUBLICATIONS

U.S. Appl. No. 13/331,554, filed Dec. 20, 2011.

*Primary Examiner* — Steven J Fulk
*Assistant Examiner* — Eric Ward
(74) *Attorney, Agent, or Firm* — Greer Burns & Crain, Ltd.

(57) ABSTRACT

A wafer processing method transfers an optical device layer (ODL) in an optical device wafer (ODW) to a transfer substrate. The ODL is formed on the front side of an epitaxy substrate through a buffer layer, and is partitioned by a plurality of crossing streets to define a plurality of regions where optical devices are formed. The transfer substrate is bonded to the front side of the ODL. The transfer substrate and the ODL are cut along the streets. The transfer substrate is attached to a supporting member, and a laser beam is applied to the epitaxy substrate from the back side of the epitaxy substrate to the unit of the ODW and the transfer substrate. The focal point of the laser beam is set in the buffer layer, thereby decomposing the buffer layer. The epitaxy substrate is then peeled off from the ODL.

6 Claims, 10 Drawing Sheets

(56) References Cited

U.S. PATENT DOCUMENTS

| | | | |
|---|---|---|---|
| 7,202,141 B2 * | 4/2007 | Park et al. | 438/458 |
| 7,622,366 B2 * | 11/2009 | Nakamura | 438/463 |
| 8,158,490 B2 * | 4/2012 | Umemura et al. | 438/458 |
| 8,163,582 B2 * | 4/2012 | Zimmerman et al. | 438/46 |
| 8,399,272 B2 * | 3/2013 | Yamae et al. | 438/33 |
| 8,679,280 B2 * | 3/2014 | Dang et al. | 156/247 |
| 2010/0311225 A1 | 12/2010 | Sekiya | |
| 2011/0177633 A1 | 7/2011 | Iwayama et al. | |

FOREIGN PATENT DOCUMENTS

| | | |
|---|---|---|
| JP | 2005-032895 | 2/2005 |
| JP | 2005-516415 | 6/2005 |
| JP | 2007-534164 | 11/2007 |
| JP | 2009-099675 | 5/2009 |
| WO | WO 03/065420 | 8/2003 |
| WO | WO 2005/094320 | 10/2005 |

* cited by examiner

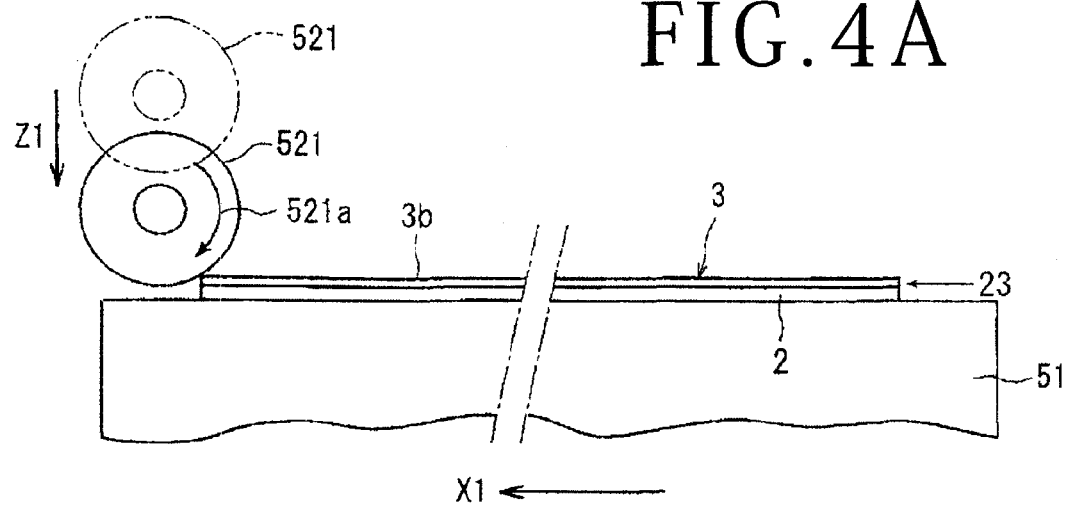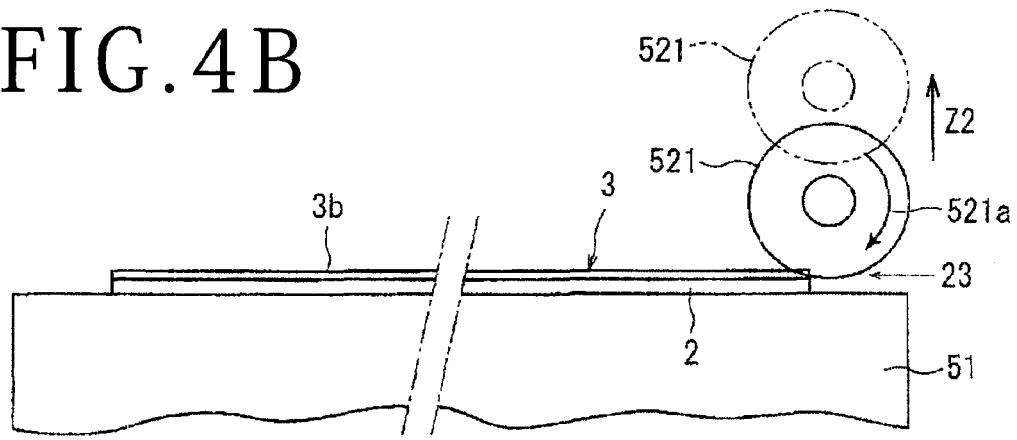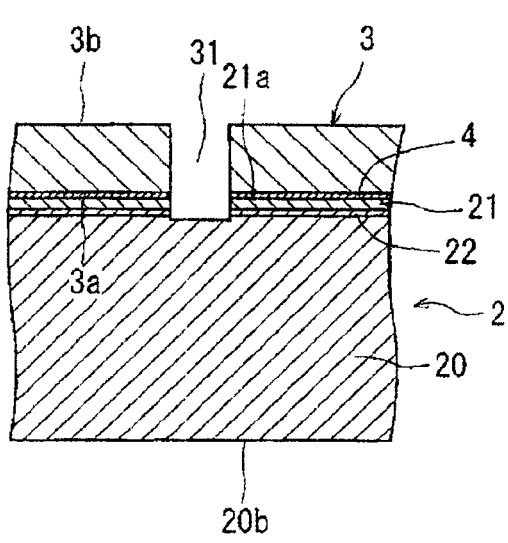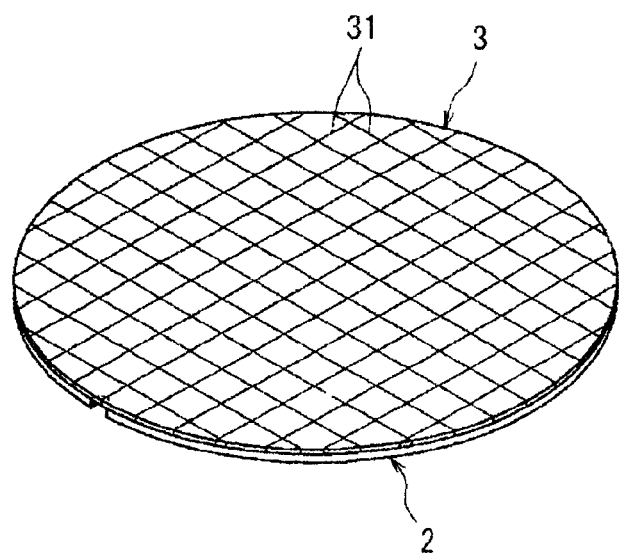

OPTICAL DEVICE WAFER PROCESSING METHOD

BACKGROUND OF THE INVENTION

1. Field of the Invention

The present invention relates to an optical device wafer processing method for transferring an optical device layer in an optical device wafer to a transfer substrate, the optical device layer being composed of an n-type semiconductor layer and a p-type semiconductor layer, formed on the front side of an epitaxy substrate such as a sapphire substrate and a silicon carbide substrate through a buffer layer, and partitioned by a plurality of crossing streets to define a plurality of regions where optical devices such as light emitting diodes and laser diodes are respectively formed.

2. Description of the Related Art

In an optical device fabrication process, an optical device layer composed of an n-type semiconductor layer and a p-type semiconductor layer is formed on the front side of a substantially disk-shaped epitaxy substrate such as a sapphire substrate and a silicon carbide substrate through a buffer layer, and this optical device layer is partitioned by a plurality of crossing streets into a plurality of regions where a plurality of optical devices such as light emitting diodes and laser diodes are respectively formed, thus constituting an optical device wafer. The optical device wafer is divided along the streets to thereby obtain the individual optical devices (see Japanese Patent Laid-open No. Hei 10-305420, for example).

Further, as a technique for improving the luminance of an optical device, a manufacturing method called lift-off is disclosed in JP-T-2005-516415. In an optical device wafer, an optical device layer composed of an n-type semiconductor layer and a p-type semiconductor layer is formed on the front side of an epitaxy substrate such as a sapphire substrate and a silicon carbide substrate through a buffer layer. The above-mentioned method called lift-off includes the steps of bonding the optical device layer of the optical device wafer through a bonding metal layer formed of gold (Au), platinum (Pt), chromium (Cr), indium (In), or palladium (Pd) to a transfer substrate formed of molybdenum (Mo), copper (Cu), or silicon (Si) and next applying a laser beam from the back side of the epitaxy substrate to the buffer layer to thereby peel off the epitaxy substrate, thus transferring the optical device layer to the transfer substrate.

SUMMARY OF THE INVENTION

In the technique disclosed in JP-T-2005-516415, the step of bonding the transfer substrate to the optical device layer formed on the front side of the epitaxy substrate is performed by heating to 220 to 300° C. Accordingly, warpage occurs in the unit of the epitaxy substrate and the transfer substrate bonded together because of a difference in coefficient of linear expansion between the epitaxy substrate and the transfer substrate. As a result, in peeling off the epitaxy substrate from the optical device layer, it is difficult to accurately set the focal point of the laser beam in the buffer layer formed between the epitaxy substrate and the optical device layer, causing such a problem that the optical device layer may be damaged or the buffer layer may not be surely decomposed to result in unsmooth peeling of the epitaxy substrate.

It is therefore an object of the present invention to provide an optical device wafer processing method which can smoothly transfer the optical device layer formed on the front side of the epitaxy substrate constituting the optical device wafer to the transfer substrate without damage to the optical device layer.

In accordance with an aspect of the present invention, there is provided an optical device wafer processing method for transferring an optical device layer in an optical device wafer to a transfer substrate, the optical device layer being formed on the front side of an epitaxy substrate through a buffer layer, and partitioned by a plurality of crossing streets to define a plurality of regions where optical devices are respectively formed, the optical device wafer processing method including: a transfer substrate bonding step of bonding the transfer substrate to the front side of the optical device layer formed on the front side of the epitaxy substrate through the buffer layer; a transfer substrate cutting step of cutting the transfer substrate bonded to the front side of the optical device layer together with the optical device layer along the streets; a supporting member attaching step of attaching the transfer substrate to a supporting member after performing the transfer substrate cutting step; a peeling laser beam applying step of applying a laser beam having a transmission wavelength to the epitaxy substrate from the back side of the epitaxy substrate to a unit of the optical device wafer and the transfer substrate in a condition where the focal point of the laser beam is set in the buffer layer, thereby decomposing the buffer layer; and an epitaxy substrate peeling step of peeling off the epitaxy substrate from the optical device layer after performing the peeling laser beam applying step.

Preferably, the transfer substrate cutting step includes the step of cutting the transfer substrate along the streets by using a cutting blade. Alternatively, the transfer substrate cutting step includes the step of cutting the transfer substrate along the streets by applying a laser beam to the transfer substrate along the streets.

In the transfer substrate cutting step of the optical device wafer processing method according to the present invention, the transfer substrate is cut along the streets to thereby relieve the warpage occurring in the unit of the epitaxy substrate and the transfer substrate due to the difference in coefficient of linear expansion between the epitaxy substrate and the transfer substrate. Accordingly, in performing the peeling laser beam applying step, the focal point of the laser beam can be accurately positioned in the buffer layer. The buffer layer is formed of gallium nitride (GaN), and it is decomposed as $2GaN \rightarrow 2Ga+N_2$ by the application of the laser beam. Thus, $N_2$ gas is produced to have an adverse effect on the optical device layer. However, since the transfer substrate is divided along division grooves into a plurality of pieces respectively corresponding to the individual optical devices, the $N_2$ gas produced can be relieved through the division grooves to thereby reduce the adverse effect on the optical device layer.

The above and other objects, features and advantages of the present invention and the manner of realizing them will become more apparent, and the invention itself will best be understood from a study of the following description and appended claims with reference to the attached drawings showing some preferred embodiments of the invention.

BRIEF DESCRIPTION OF THE DRAWINGS

FIGS. 4A and 4B are sectional side views for illustrating the first preferred embodiment of the transfer substrate cutting step in the optical device wafer processing method according to the present invention;

FIG. 4C is an enlarged sectional view of an essential part of the unit of the optical device wafer and the transfer substrate cut by the first preferred embodiment of the transfer substrate cutting step shown in FIGS. 4A and 4B;

FIG. 4D is a perspective view of the unit of the optical device wafer and the transfer substrate cut by the first preferred embodiment of the transfer substrate cutting step shown in FIGS. 4A and 4B;

DETAILED DESCRIPTION OF THE PREFERRED EMBODIMENT

Figure 1A:
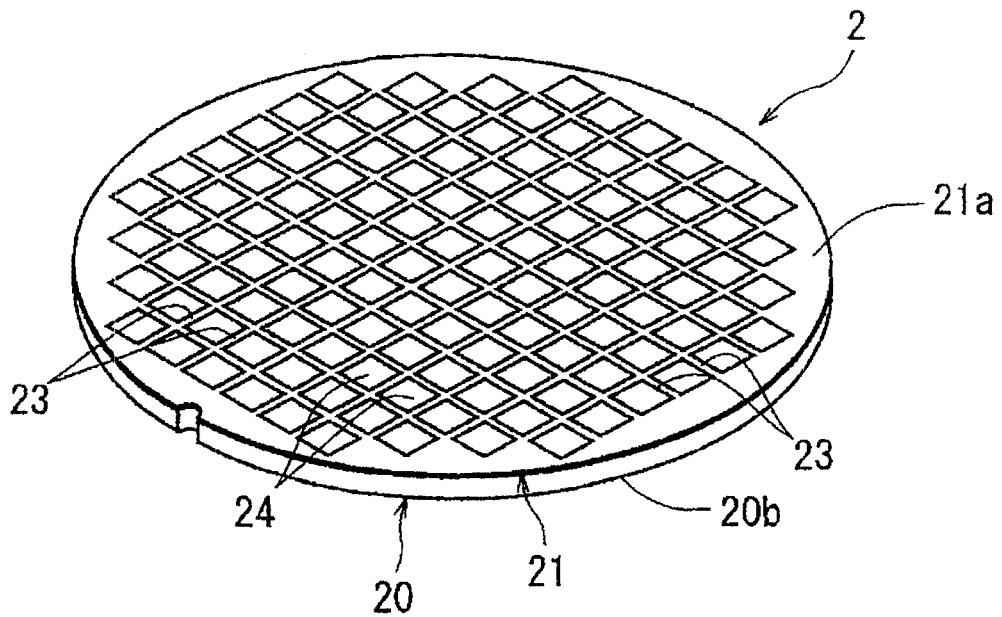
FIG. 1A is a perspective view of an optical device wafer to be processed by an optical device wafer processing method according to the present invention.
Figure 1B:
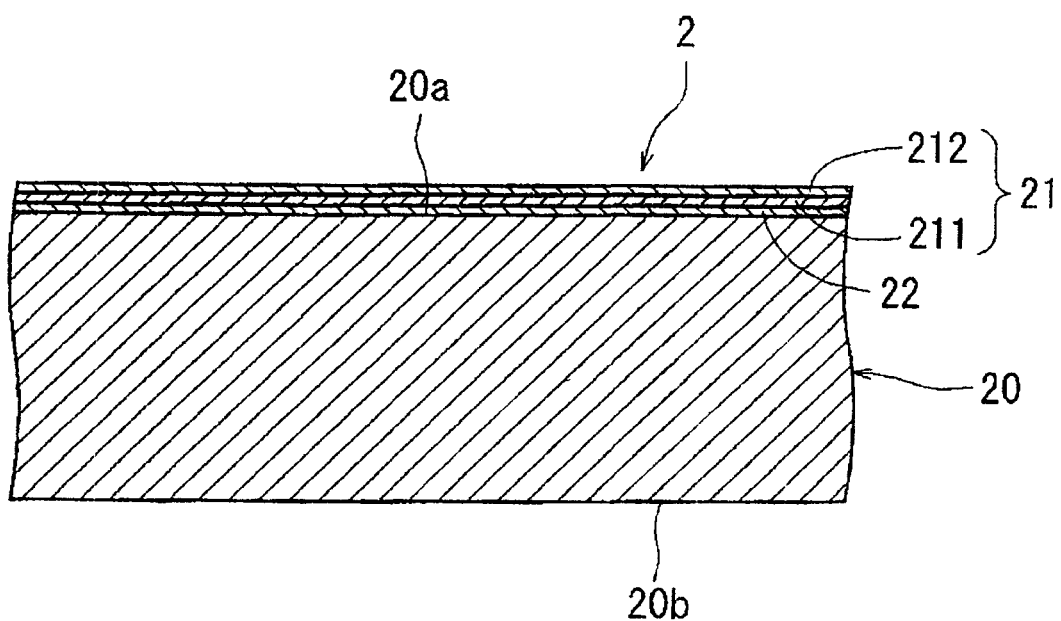
FIG. 1B is an enlarged sectional view of an essential part of the optical device wafer shown in FIG. 1A.

A preferred embodiment of the optical device wafer processing method according to the present invention will now be described in detail with reference to the attached drawings. FIG. 1A is a perspective view of an optical device wafer 2 to be processed by the optical device wafer processing method according to the present invention, and FIG. 1B is an enlarged sectional view of an essential part of the optical device wafer 2 shown in FIG. 1A. The optical device wafer 2 shown in FIGS. 1A and 1B is formed by epitaxial growth of an optical device layer 21 on the front side 20a of a substantially circular epitaxy substrate 20 such as a sapphire substrate and a silicon carbide substrate. The optical device layer 21 is composed of an n-type gallium nitride semiconductor layer 211 and a p-type gallium nitride semiconductor layer 212. In forming the optical device layer 21 composed of the n-type gallium nitride semiconductor layer 211 and the p-type gallium nitride semiconductor layer 212 on the front side 20a of the epitaxy substrate 20 by epitaxial growth, a buffer layer 22 of gallium nitride (GaN) is formed between the front side 20a of the epitaxy substrate 20 and the n-type gallium nitride semiconductor layer 211 forming the optical device layer 21. In the thus configured optical device wafer 2, the epitaxy substrate 20 has a thickness of 430 μm, for example, and the optical device layer 21 has a thickness of 5 μm, for example, inclusive of the thickness of the buffer layer 22 in the embodiment shown in the figure. As shown in FIG. 1A, the optical device layer 21 is partitioned by a plurality of crossing streets 23 to define a plurality of regions where a plurality of optical devices 24 are respectively formed.

Figure 2A:
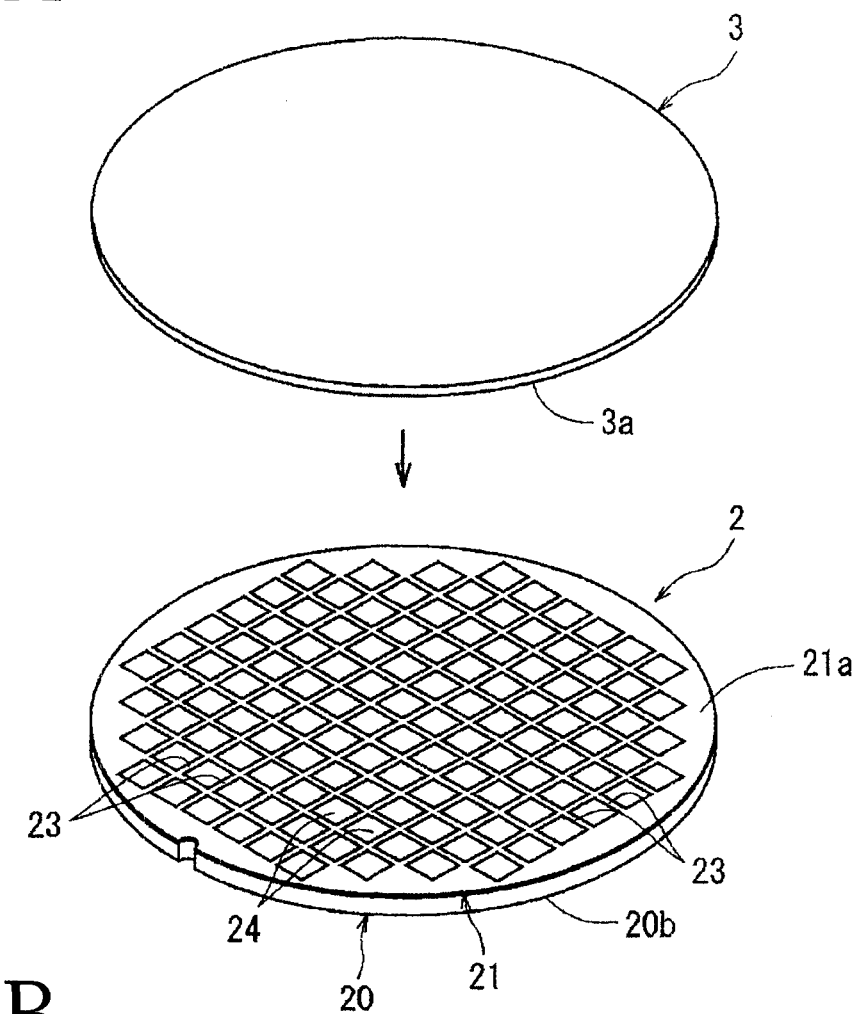
FIG. 2A is a perspective view for illustrating a transfer substrate bonding step in the optical device wafer processing method according to the present invention.
Figure 2B:
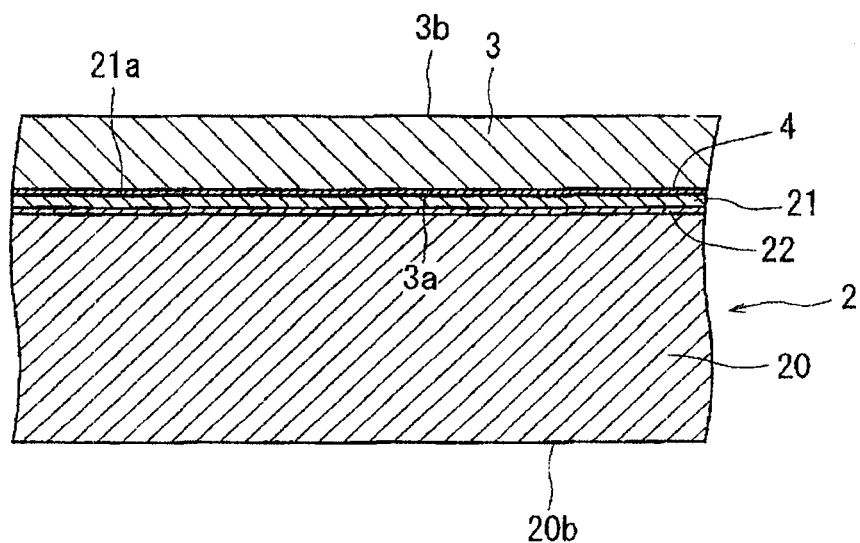
FIG. 2B is an enlarged sectional view of an essential part of the unit of the optical device wafer and the transfer substrate bonded together by the transfer substrate bonding step shown in FIG. 2A.

To peel off the epitaxy substrate 20 from the optical device layer 21 in the optical device wafer 2 and transfer the optical device layer 21 to a transfer substrate, a transfer substrate bonding step is first performed in such a manner that the transfer substrate is bonded to the front side 21a of the optical device layer 21. More specifically, as shown in FIGS. 2A and 2B, a transfer substrate 3 having a thickness of 220 μm, for example, is bonded through a bonding metal layer 4 to the front side 21a of the optical device layer 21 formed on the front side 20a of the epitaxy substrate 20 constituting the optical device wafer 2. The transfer substrate 3 is formed of molybdenum (Mo), copper (Cu), or silicon (Si), for example. The bonding metal layer 4 is formed of gold (Au), platinum (Pt), chromium (Cr), indium (In), or palladium (Pd), for example, as a bonding metal.

The transfer substrate bonding step is performed in the following manner. The bonding metal mentioned above is deposited by evaporation on the front side 21a of the optical device layer 21 formed on the front side 20a of the epitaxy substrate 20 or on the front side 3a of the transfer substrate 3, thereby forming the bonding metal layer 4 having a thickness of about 3 μm. Thereafter, the bonding metal layer 4 is brought into pressure contact with the front side 3a of the transfer substrate 3 or the front side 21a of the optical device 21, thereby bonding the front side 3a of the transfer substrate 3 through the bonding metal layer 4 to the front side 21a of the optical device layer 21 constituting the optical device wafer 2. In bonding the transfer substrate 3 to the front side 21a of the optical device layer 21 formed on the front side 20a of the epitaxy substrate 20, the epitaxy substrate 20 and the transfer substrate 3 are heated to 220 to 300° C. Accordingly, warpage occurs in the unit of the epitaxy substrate 20 and the transfer substrate 3 bonded together because of a difference in coefficient of linear expansion between the epitaxy substrate 20 and the transfer substrate 3. In the case that the diameter of the epitaxy substrate 20 is 10 cm, the amount of this warpage is about 0.5 mm.

After performing the transfer substrate bonding step, a transfer substrate cutting step is performed in such a manner that the transfer substrate 3 is cut together with the optical device layer 21 along the streets 23. A first preferred embodiment of the transfer substrate cutting step will now be described with reference to FIG. 3 and FIGS. 4A to 4D. The first preferred embodiment of the transfer substrate cutting step is performed by using a cutting apparatus 5 shown in FIG. 3. The cutting apparatus 5 shown in FIG. 3 includes a chuck table 51 for holding a workpiece, cutting means 52 having a cutting blade 521 for cutting the workpiece held on the chuck table 51, and imaging means 53 for imaging the workpiece held on the chuck table 51. The chuck table 51 is so configured as to hold the workpiece under suction. The chuck table 51 is movable in a feeding direction shown by an arrow X in FIG. 3 by feeding means (not shown) and also movable in an indexing direction shown by an arrow Y in FIG. 3 by indexing means (not shown). The cutting blade 521 of the cutting means 52 is rotatable about an axis extending in the indexing direction and movable in a direction perpendicular to the upper surface of the chuck table 51. In the preferred embodiment shown in the figure, the imaging means 53 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 53 is transmitted to control means (not shown).

Figure 3:
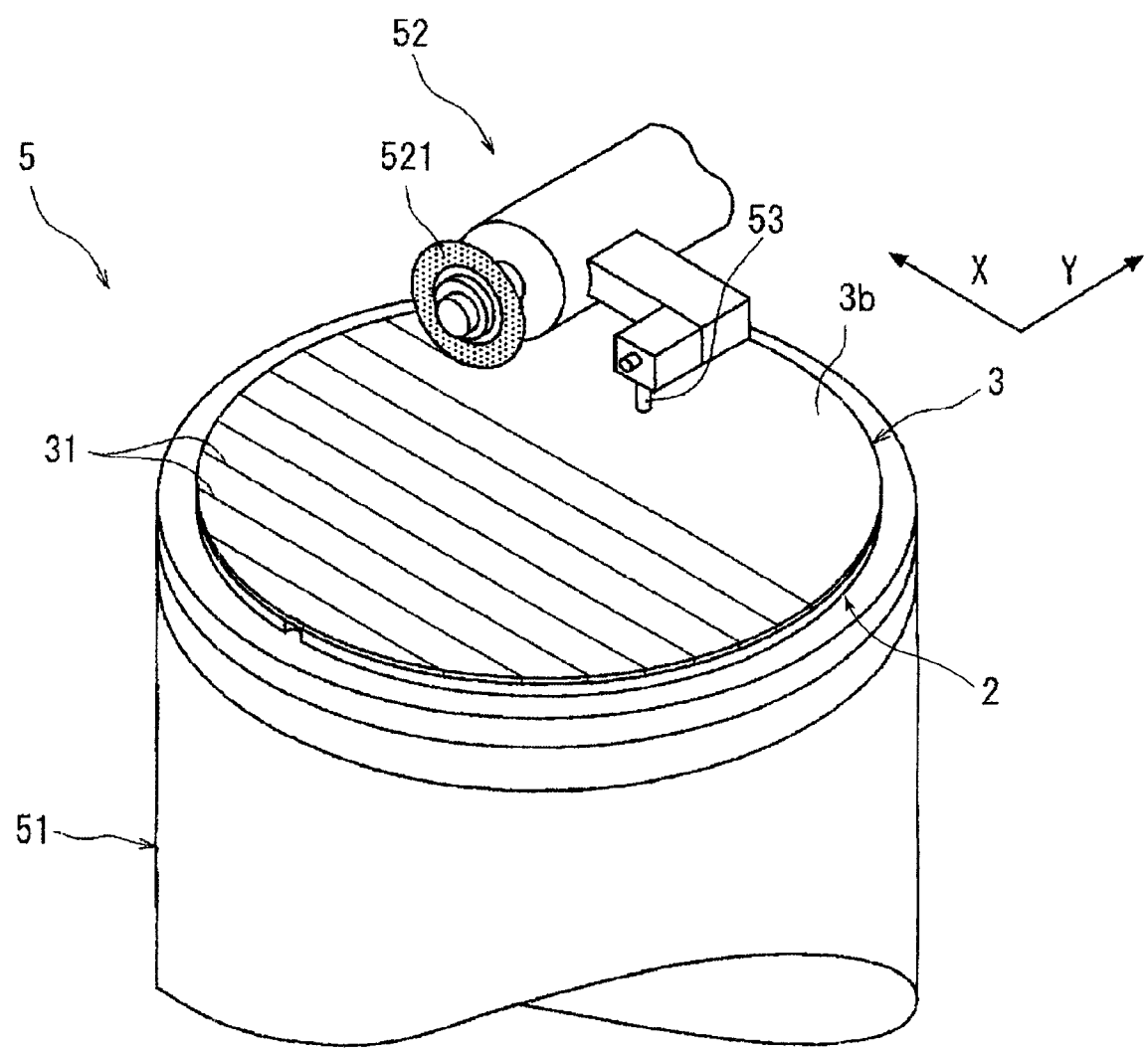
FIG. 3 is a perspective view of an essential part of a cutting apparatus for performing a first preferred embodiment of a transfer substrate cutting step in the optical device wafer processing method according to the present invention.

The transfer substrate cutting step using the thus configured cutting apparatus 5 is performed in the following manner. The unit of the optical device wafer 2 and the transfer substrate 3 bonded together in the transfer substrate bonding step mentioned above is placed on the chuck table 51 of the cutting apparatus 5 in the condition where the epitaxy substrate 20 of the optical device wafer 2 comes into contact with the upper surface of the chuck table 51 as shown in FIG. 3. Accordingly, the back side 3b of the transfer substrate 3 bonded to the front side 21a of the optical device layer 21 formed on the front side 20a of the epitaxy substrate 20 constituting the optical device wafer 2 is oriented upward. By operating suction means (not shown), the unit of the optical device wafer 2 and the transfer substrate 3 is held under suction on the chuck table 51. The chuck table 51 thus holding the unit of the optical device wafer 2 and the transfer substrate 3 under suction is moved to a position directly below the imaging means 53 by the feeding means (not shown).

When the chuck table 51 is positioned directly below the imaging means 53, an alignment operation is performed by the imaging means 53 and the control means (not shown) to detect a cutting area of the transfer substrate 3. In the case that the transfer substrate 3 is formed from a silicon substrate, the imaging means 53 and the control means (not shown) perform image processing such as pattern matching for making the alignment between the cutting blade 521 and the streets 23 extending in a first direction on the optical device layer 21 of the optical device wafer 2, thereby performing the alignment in the cutting area for the streets 23 extending in the first direction (alignment step). Similarly, the imaging means 53 and the control means perform the alignment in the cutting area for the other streets 23 extending in a second direction perpendicular to the first direction on the optical device layer 21 of the optical device wafer 2.

Although the transfer substrate 3 is present on the upper side of the optical device layer 21 where the streets 23 are formed, the streets 23 can be imaged through the transfer substrate 3 formed from a silicon substrate because the imaging means 53 includes the infrared light applying means for applying infrared light, the optical system for capturing the infrared light, and the imaging device (infrared CCD) for outputting an electrical signal corresponding to the infrared light as mentioned above. In the case that the transfer substrate 3 is formed from a metal substrate, a holding portion of the chuck table 51 for holding the workpiece is formed from a transparent member and the streets 23 are imaged from the lower side of the holding portion.

After performing the alignment operation for detecting the cutting area of the transfer substrate 3 bonded to the optical device wafer 2 held on the chuck table 51, the chuck table 51 holding the transfer substrate 3 bonded to the optical device wafer 2 is moved to a cutting start position below the cutting blade 521 as shown in FIG. 4A. At this cutting start position, one end (left end as viewed in FIG. 4A) of a predetermined one of the streets 23 extending in the first direction is positioned on the right side of the cutting blade 521 by a predetermined small amount as shown in FIG. 4A. Thereafter, the cutting blade 521 is rotated in the direction shown by an arrow 521a in FIG. 4A and simultaneously moved down by a predetermined amount in the direction shown by an arrow Z1 in FIG. 4A from a standby position shown by a two-dot chain line in FIG. 4A to a working position shown by a solid line in FIG. 4A. This movement from the standby position to the working position is performed by operating vertically moving means (not shown) for moving the cutting blade 521 in the direction perpendicular to the upper surface of the chuck table 51. The working position of the cutting blade 521 is set so that the outer circumference of the cutting blade 521 reaches the buffer layer 22. After moving the cutting blade 521 from the standby position to the working position as mentioned above, the chuck table 51 is moved at a predetermined feed speed in the direction shown by an arrow X1 in FIG. 4A as rotating the cutting blade 521 in the direction shown by the arrow 521a. When the other end (right end as viewed in FIG. 4B) of the predetermined street 23 extending in the first direction reaches a position on the left side of the cutting blade 521 by a predetermined small amount as shown in FIG. 4B, the movement of the chuck table 51 is stopped. Thereafter, the cutting blade 521 is raised to the standby position shown by a two-dot chain line in FIG. 4B in the direction shown by an arrow Z2 in FIG. 4B.

As a result, the transfer substrate 3 and the optical device layer 21 formed on the front side of the epitaxy substrate 20 constituting the optical device wafer 2 are cut along the predetermined street 23 extending in the first direction to form a division groove 31 as a cut groove as shown in FIG. 4C (transfer substrate cutting step). The transfer substrate cutting step is performed along all of the crossing streets 23 extending in the first direction and the second direction perpendicular to the first direction to thereby form a plurality of crossing division grooves 31 on the transfer substrate 3 along all of the crossing streets 23 as shown in FIG. 4D. As mentioned above, the unit of the epitaxy substrate 20 and the transfer substrate 3 has a warpage of about 0.5 mm. This warpage is relieved to some extent by the suction on the chuck table 51, but does not become zero. Accordingly, there is a case that the epitaxy substrate 20 may be cut by the cutting blade 521.

A second preferred embodiment of the transfer substrate cutting step will now be described with reference to FIG. 5 and FIGS. 6A to 6D. The second preferred embodiment of the transfer substrate cutting step is performed by using a laser processing apparatus 6 shown in FIG. 5. The laser processing apparatus 6 shown in FIG. 5 includes a chuck table 61 for holding a workpiece, laser beam applying means 62 for applying a laser beam to the workpiece held on the chuck table 61, and imaging means 63 for imaging the workpiece held on the chuck table 61. The chuck table 61 is so configured as to hold the workpiece under suction. The chuck table 61 is movable in a feeding direction shown by an arrow X in FIG. 5 by feeding means (not shown) and also movable in an indexing direction shown by an arrow Y in FIG. 5 by indexing means (not shown).

The laser beam applying means 62 includes a cylindrical casing 621 extending in a substantially horizontal direction and focusing means 622 mounted on the front end of the casing 621 for applying a pulsed laser beam to the workpiece held on the chuck table 61. The imaging means 63 is mounted on the front end portion of the casing 621 constituting the laser beam applying means 62. In the preferred embodiment shown in the figure, the imaging means 63 includes an ordinary imaging device (CCD) for imaging the workpiece by using visible light, infrared light applying means for applying infrared light to the workpiece, an optical system for capturing the infrared light applied to the workpiece by the infrared light applying means, and an imaging device (infrared CCD) for outputting an electrical signal corresponding to the infrared light captured by the optical system. An image signal output from the imaging means 63 is transmitted to control means (not shown).

Figure 5:
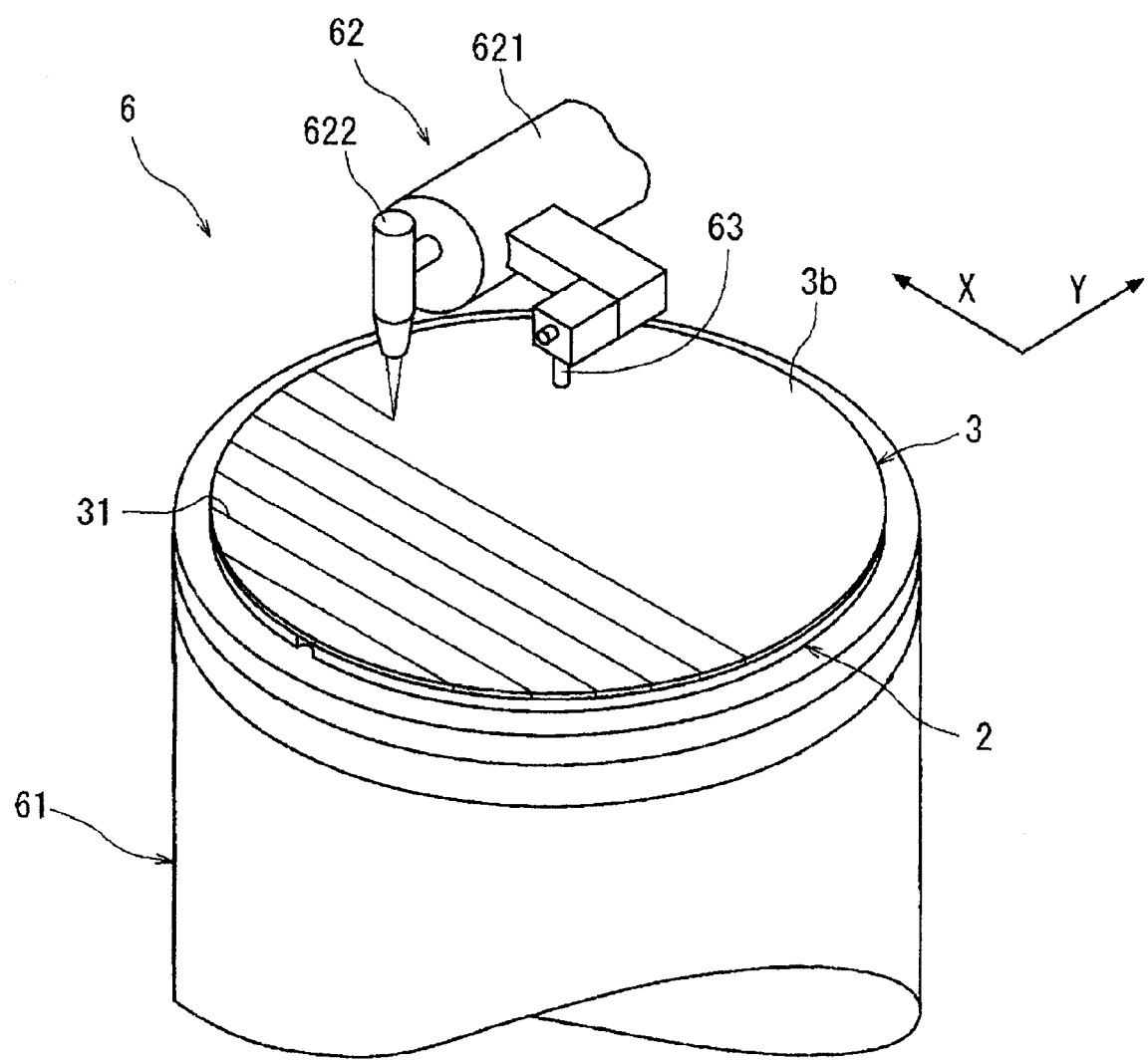
FIG. 5 is a perspective view of an essential part of a laser processing apparatus for performing a second preferred embodiment of the transfer substrate cutting step in the optical device wafer processing method according to the present invention.

The transfer substrate cutting step using the laser processing apparatus 6 will be described with reference to FIG. 5 and FIGS. 6A to 6D. The transfer substrate cutting step using the laser processing apparatus 6 is performed in the following manner. The unit of the optical device wafer 2 and the transfer substrate 3 bonded together in the transfer substrate bonding step mentioned above is placed on the chuck table 61 of the laser processing apparatus 6 in the condition where the epitaxy substrate 20 of the optical device wafer 2 comes into contact with the upper surface of the chuck table 61 as shown in FIG. 5. Accordingly, the back side 3b of the transfer substrate 3 bonded to the front side 21a of the optical device layer 21 formed on the front side 20a of the epitaxy substrate 20 constituting the optical device wafer 2 is oriented upward. By operating suction means (not shown), the unit of the optical device wafer 2 and the transfer substrate 3 is held under suction on the chuck table 61. The chuck table 61 thus holding the unit of the optical device wafer 2 and the transfer substrate 3 under suction is moved to a position directly below the imaging means 63 by the feeding means (not shown).

When the chuck table 61 is positioned directly below the imaging means 63, an alignment operation is performed by the imaging means 63 and the control means (not shown) to detect a processing area of the transfer substrate 3 to be laser-processed. In the case that the transfer substrate 3 is formed from a silicon substrate, the imaging means 63 and the control means (not shown) perform image processing such as pattern matching for making the alignment between the streets 23 extending in the first direction and the focusing means 622 of the laser beam applying means 62 for applying a laser beam along the streets 23 on the optical device layer 21 of the optical device wafer 2, thereby performing the alignment in the processing area for the streets 23 extending in the first direction (alignment step). Similarly, the imaging means 63 and the control means perform the alignment in the processing area for the other streets 23 extending in the second direction perpendicular to the first direction on the optical device layer 21 of the optical device wafer 2.

Although the transfer substrate 3 is present on the upper side of the optical device layer 21 where the streets 23 are formed, the streets 23 can be imaged through the transfer substrate 3 formed from a silicon substrate because the imaging means 63 includes the infrared light applying means for applying infrared light, the optical system for capturing the infrared light, and the imaging means (infrared CCD) for outputting an electrical signal corresponding to the infrared light as mentioned above. In the case that the transfer substrate 3 is formed from a metal substrate, a holding portion of the chuck table 61 for holding the workpiece is formed from a transparent member and the streets 23 are imaged from the lower side of the holding portion.

Figure 6A:
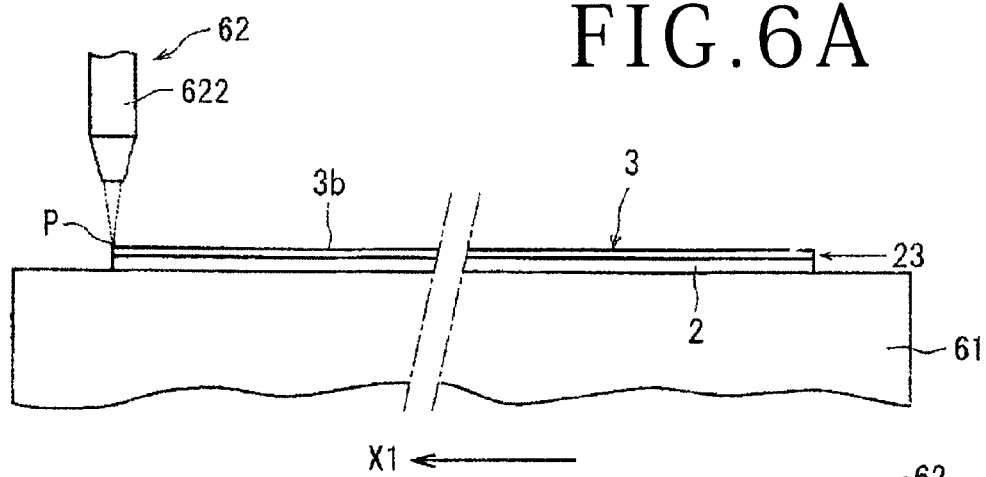
FIGS. 6A and 6B are sectional side views for illustrating the second preferred embodiment of the transfer substrate cutting step in the optical device wafer processing method according to the present invention.
Figure 6B:
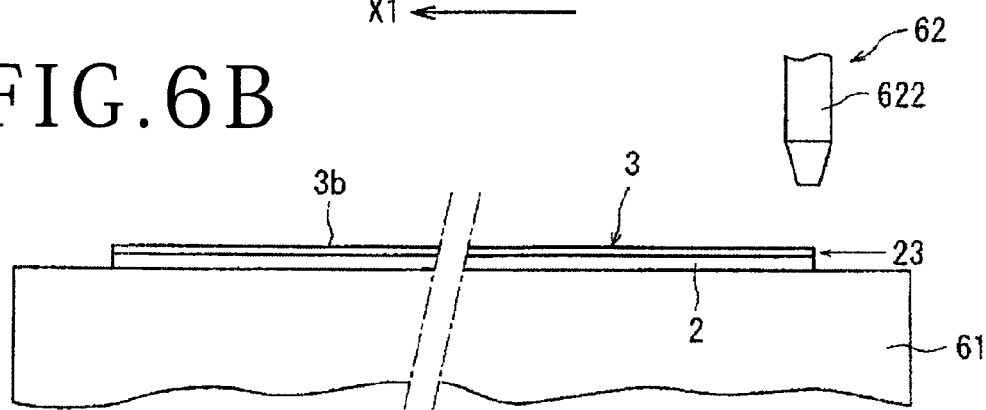

After performing the alignment operation for detecting the processing area of the transfer substrate 3 bonded to the optical device wafer 2 held on the chuck table 61, the chuck table 61 holding the transfer substrate 3 bonded to the optical device wafer 2 is moved to a processing start position below the focusing means 622 of the laser beam applying means 62 as shown in FIG. 6A. At this processing start position, one end (left end as viewed in FIG. 6A) of a predetermined one of the streets 23 extending in the first direction is positioned directly below the focusing means 622 of the laser beam applying means 62 as shown in FIG. 6A. Thereafter, a pulsed laser beam having an absorption wavelength to the transfer substrate 3 is applied from the focusing means 622 to the transfer substrate 3, and the chuck table 61 is moved in the direction shown by an arrow X1 in FIG. 6A at a predetermined feed speed. When the other end (right end as viewed in FIG. 6B) of the predetermined street 23 reaches the position directly below the focusing means 622 of the laser beam applying means 62 as shown in FIG. 6B, the application of the pulsed laser beam is stopped and the movement of the chuck table 61 is also stopped (laser beam applying step). In this laser beam applying step, the focal point P of the pulsed laser beam is set near the back side 3b (upper surface) of the transfer substrate 3. The above-mentioned laser beam applying step is performed along all of the streets 23 formed on the optical device layer 21 of the optical device wafer 2.

For example, the laser beam applying step mentioned above is performed under the following processing conditions.

Figure 6C:
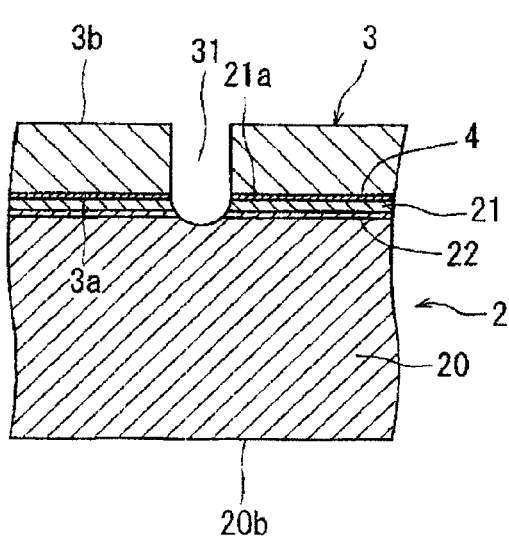
FIG. 6C is an enlarged sectional view of an essential part of the unit of the optical device wafer and the transfer substrate cut by the second preferred embodiment of the transfer substrate cutting step shown in FIGS. 6A and 6B.
Figure 6D:
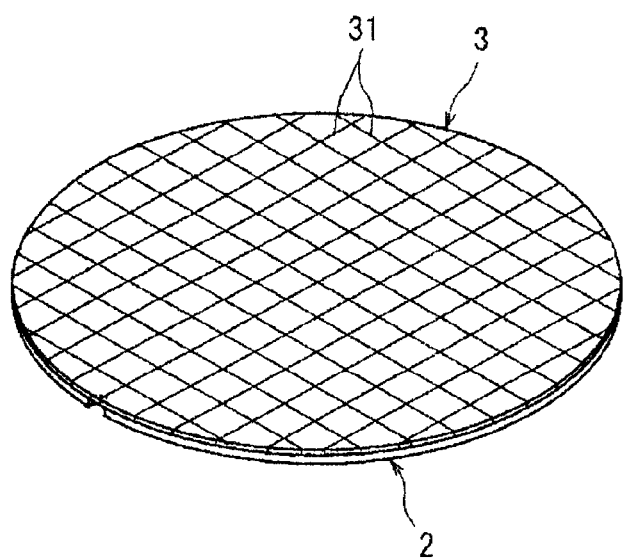
FIG. 6D is a perspective view of the unit of the optical device wafer and the transfer substrate cut by the second preferred embodiment of the transfer substrate cutting step shown in FIGS. 6A and 6B.

Light source: YAG pulsed laser
Wavelength: 355 nm
Average power: 7 W
Repetition frequency: 10 kHz
Focused spot diameter: ellipse having a minor axis set to 10 µm and a major axis set to 10 to 200 µm
Work feed speed: 100 mm/s The laser beam applying step is repeated 4 to 6 times along each street 23 under the above processing conditions. As a result, the transfer substrate 3 and the optical device layer 21 formed on the front side of the epitaxy substrate 20 constituting the optical device wafer 2 are cut along the predetermined street 23 extending in the first direction to form a division groove 31 as a laser processed groove as shown in FIG. 6C (transfer substrate cutting step). The transfer substrate cutting step is performed along all of the crossing streets 23 extending in the first direction and the second direction perpendicular to the first direction to thereby form a plurality of crossing division grooves 31 on the transfer substrate 3 along all of the crossing streets 23 as shown in FIG. 6D.

By performing the transfer substrate cutting step to cut the transfer substrate 3 and the optical device layer 21 along all of the crossing streets 23 as described above, it is possible to relieve the warpage occurring in the unit of the epitaxy substrate 20 and the transfer substrate 3 due to the difference in coefficient of linear expansion between the epitaxy substrate 20 and the transfer substrate 3.

Figure 7:
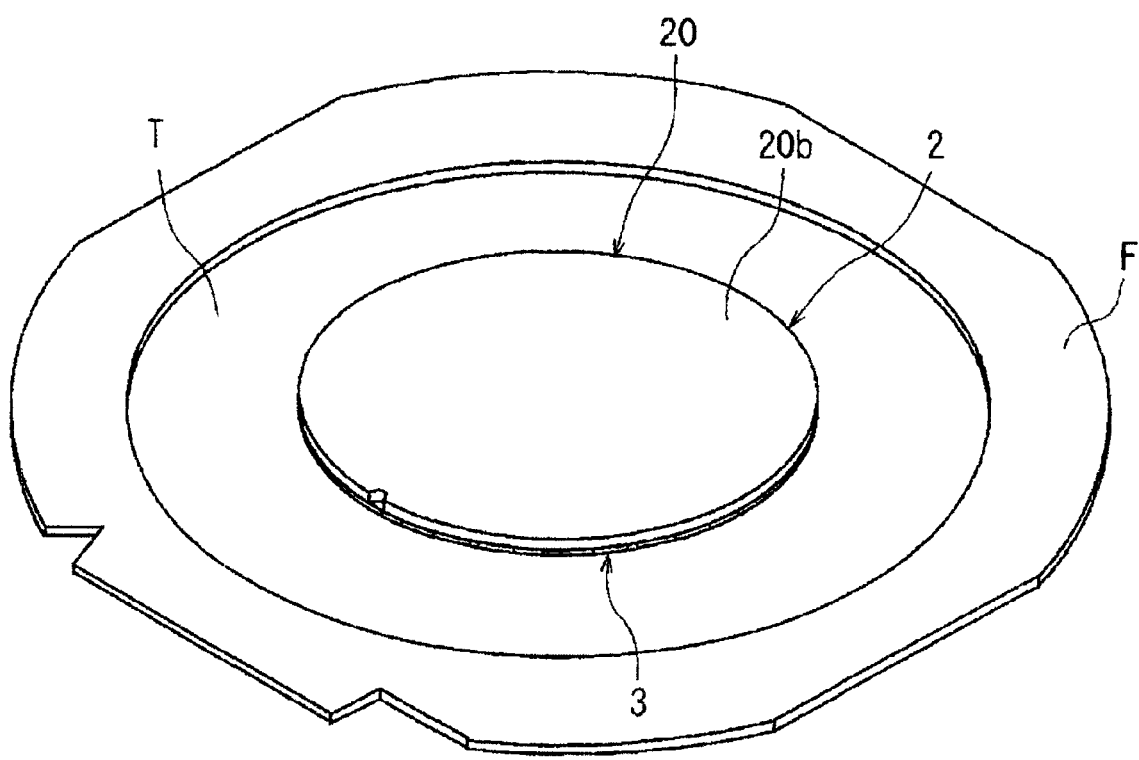
FIG. 7 is a perspective view for illustrating an optical device wafer supporting step in the optical device wafer processing method according to the present invention.

After performing the transfer substrate cutting step along all of the crossing streets 23, an optical device wafer supporting step is performed in such a manner that the unit of the optical device wafer 2 and the transfer substrate 3 is attached to a dicing tape as a supporting member supported to an annular frame. More specifically, as shown in FIG. 7, the transfer substrate 3 bonded to the optical device wafer 2 is attached to the front side (upper surface) of a dicing tape T as a supporting member supported to an annular frame F (supporting member attaching step). Accordingly, the back side 20b of the epitaxy substrate 20 of the optical device wafer 2 bonded to the transfer substrate 3 attached to the upper surface of the dicing tape T is oriented upward.

After performing the optical device wafer supporting step as described above, a peeling laser beam applying step is performed in such a manner that a laser beam having a transmission wavelength to the epitaxy substrate 20 is applied from the back side 20b of the epitaxy substrate 20 to the optical device wafer 2 in the condition where the focal point of the laser beam is set in the buffer layer 22 to decompose the buffer layer 22. This peeling laser beam applying step is performed by using a laser processing apparatus 7 shown in FIG. 8. The laser processing apparatus 7 shown in FIG. 8 includes a chuck table 71 for holding a workpiece and laser beam applying means 72 for applying a laser beam to the workpiece held on the chuck table 71. The chuck table 71 is so configured as to hold the workpiece under suction. The chuck table 71 is movable in a feeding direction shown by an arrow X in FIG. 8 by feeding means (not shown) and also movable in an indexing direction shown by an arrow Y in FIG. 8 by indexing means (not shown). The laser beam applying means 72 includes a cylindrical casing 721 extending in a substantially horizontal direction and focusing means 722 mounted on the front end of the casing 721 for applying a pulsed laser beam to the workpiece held on the chuck table 71.

Figure 8:
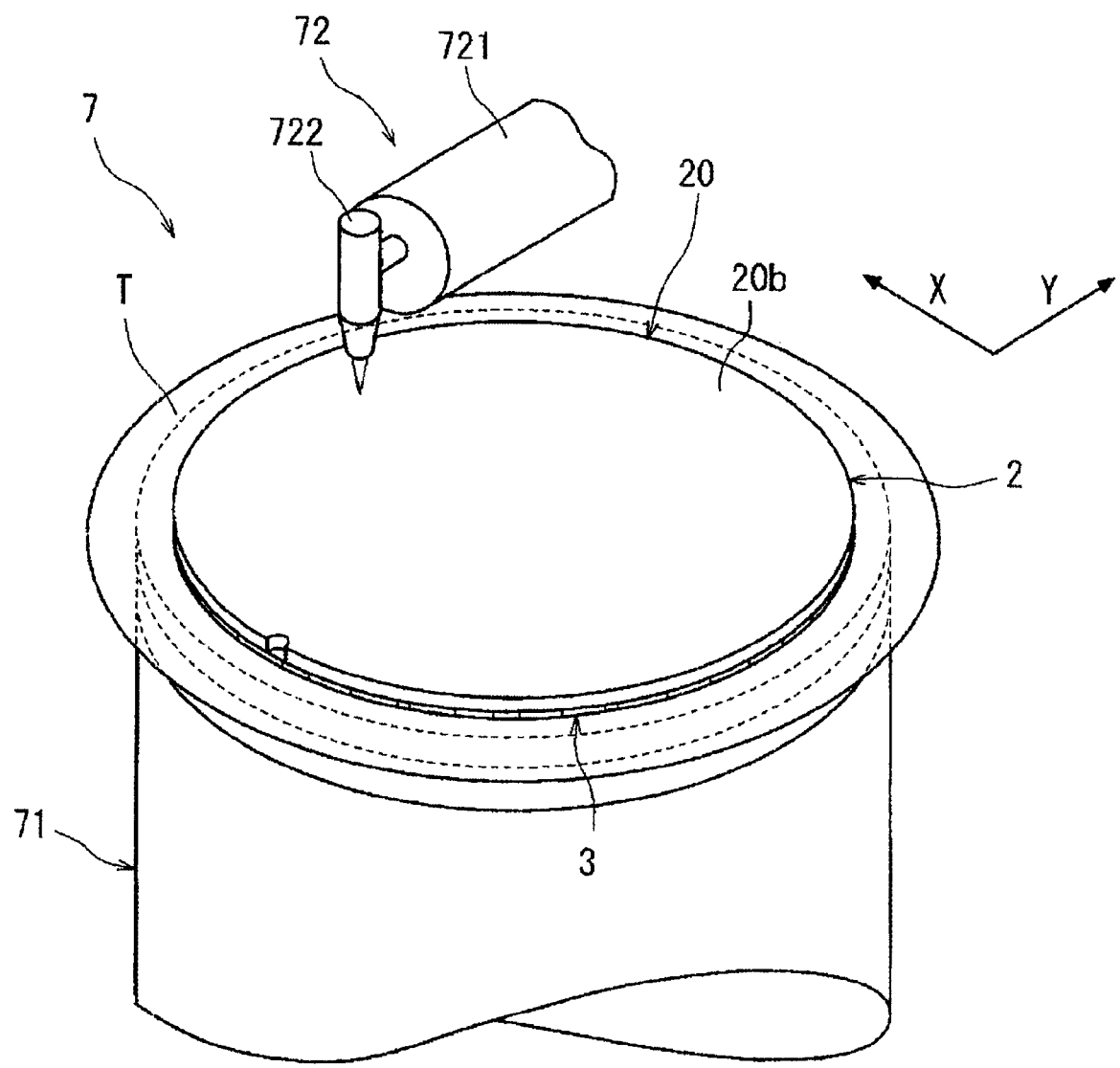
FIG. 8 is a perspective view of an essential part of a laser processing apparatus for performing a peeling laser beam applying step in the optical device wafer processing method according to the present invention.

The peeling laser beam applying step using the laser processing apparatus 7 will now be described with reference to FIG. 8 and FIGS. 9A to 9C. As shown in FIG. 8 described above, in the peeling laser beam applying step, the unit of the optical device wafer 2, the transfer substrate 3, and the dicing tape T bonded together is placed on the chuck table 71 of the laser processing apparatus 7 in the condition where the dicing tape T comes into contact with the upper surface of the chuck table 71. By operating suction means (not shown), the unit of the optical device wafer 2, the transfer substrate 3, and the dicing tape T is held under suction on the chuck table 71. Accordingly, the back side 20b of the epitaxy substrate 20 of the optical device wafer 2 bonded to the transfer substrate 3 attached to the dicing tape T held on the chuck table 71 is oriented upward. While the annular frame F supporting the dicing tape T is not shown in FIG. 8, the annular frame F is held by any suitable frame holding means provided on the chuck table 71.

Figure 9A:
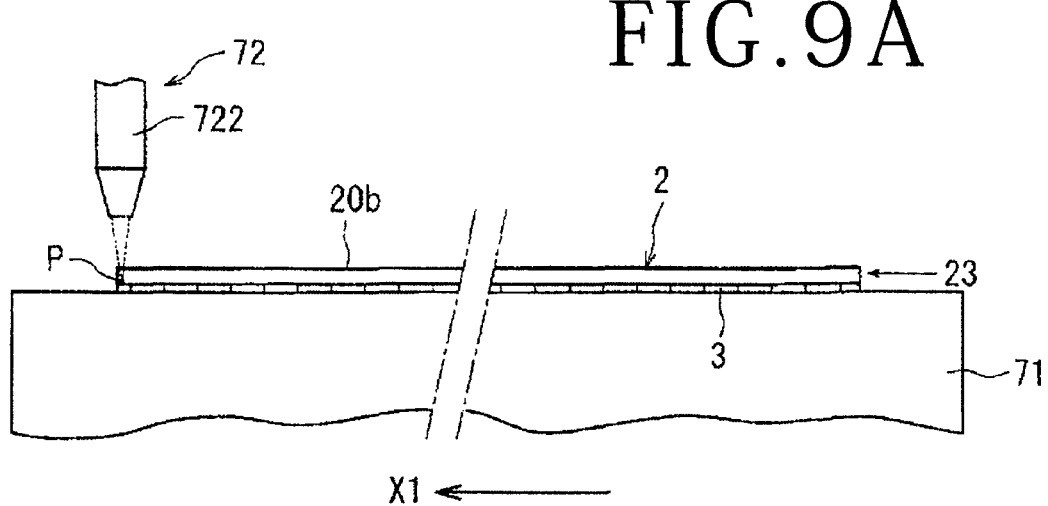
FIGS. 9A to 9C are views for illustrating the peeling laser beam applying step in the optical device wafer processing method according to the present invention.
Figure 9B:
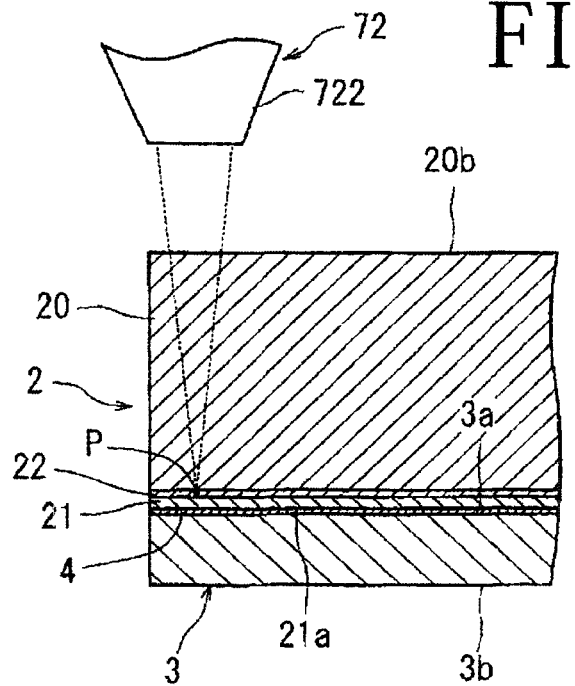
Figure 9C:
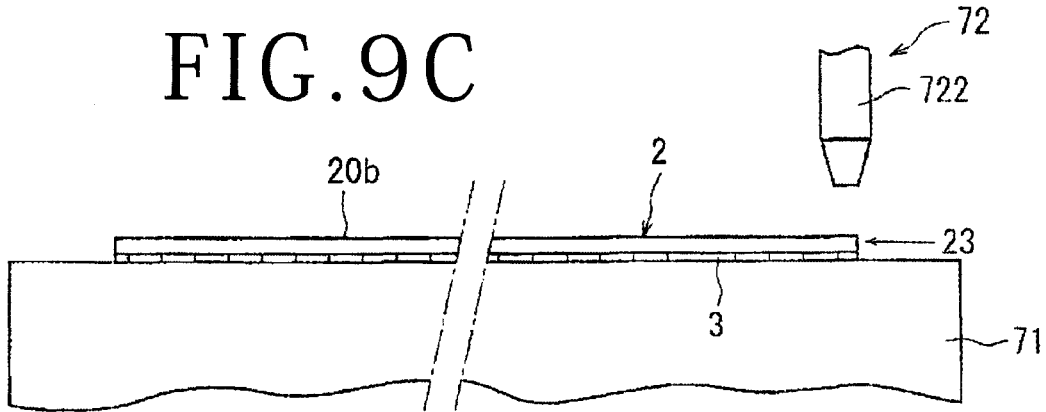

Thereafter, the chuck table 71 holding the unit of the optical device wafer 2, the transfer substrate 3, and the dicing tape T under suction is moved to a processing start position below the focusing means 722 of the laser beam applying means 72 as shown in FIG. 9A. At this processing start position, one end (left end as viewed in FIG. 9A) of the epitaxy substrate 20 is positioned directly below the focusing means 722 of the laser beam applying means 72 as shown in FIG. 9A. Thereafter, the focal point P of the pulsed laser beam to be applied from the focusing means 722 is set in the buffer layer 22 as shown in FIG. 9B. Then, the laser beam applying means 72 is operated to apply the pulsed laser beam from the focusing means 722 to the buffer layer 22, and the chuck table 71 is moved in the direction shown by an arrow X1 in FIG. 9A at a predetermined feed speed. When the other end (right end as viewed in FIG. 9C) of the epitaxy substrate 20 reaches the position directly below the focusing means 722 of the laser beam applying means 72 as shown in FIG. 9C, the application of the pulsed laser beam is stopped and the movement of the chuck table 71 is also stopped (peeling laser beam applying step). This peeling laser beam applying step is performed over the entire surface of the buffer layer 22. As a result, the buffer layer 22 is decomposed to lose its binding function of binding the epitaxy substrate 20 and the optical device layer 21.

For example, the peeling laser beam applying step mentioned above is performed under the following processing conditions.

Light source: excimer pulsed laser
Wavelength: 284 nm
Average power: 0.08 W
Repetition frequency: 50 kHz
Focused spot diameter: φ 400 μm
Work feed speed: 20 mm/s In the transfer substrate cutting step mentioned above, the transfer substrate 3 is cut along the crossing streets 23 to thereby relieve the warpage occurring in the unit of the epitaxy substrate 20 and the transfer substrate 3 due to the difference in coefficient of linear expansion between the epitaxy substrate 20 and the transfer substrate 3. Accordingly, in performing the peeling laser beam applying step, the focal point P of the pulsed laser beam to be applied from the focusing means 722 can be accurately positioned in the buffer layer 22. The buffer layer 22 is formed of gallium nitride (GaN), and it is decomposed as 2GaN→2Ga+N2 by the application of the laser beam. Thus, N2 gas is produced to have an adverse effect on the optical device layer 21. However, since the transfer substrate 3 is divided along the division grooves 31 into a plurality of pieces respectively corresponding to the individual optical devices 24 in the transfer substrate cutting step, the N2 gas produced can be relieved through the division grooves 31 to thereby reduce the adverse effect on the optical device layer 21.

Figure 10:
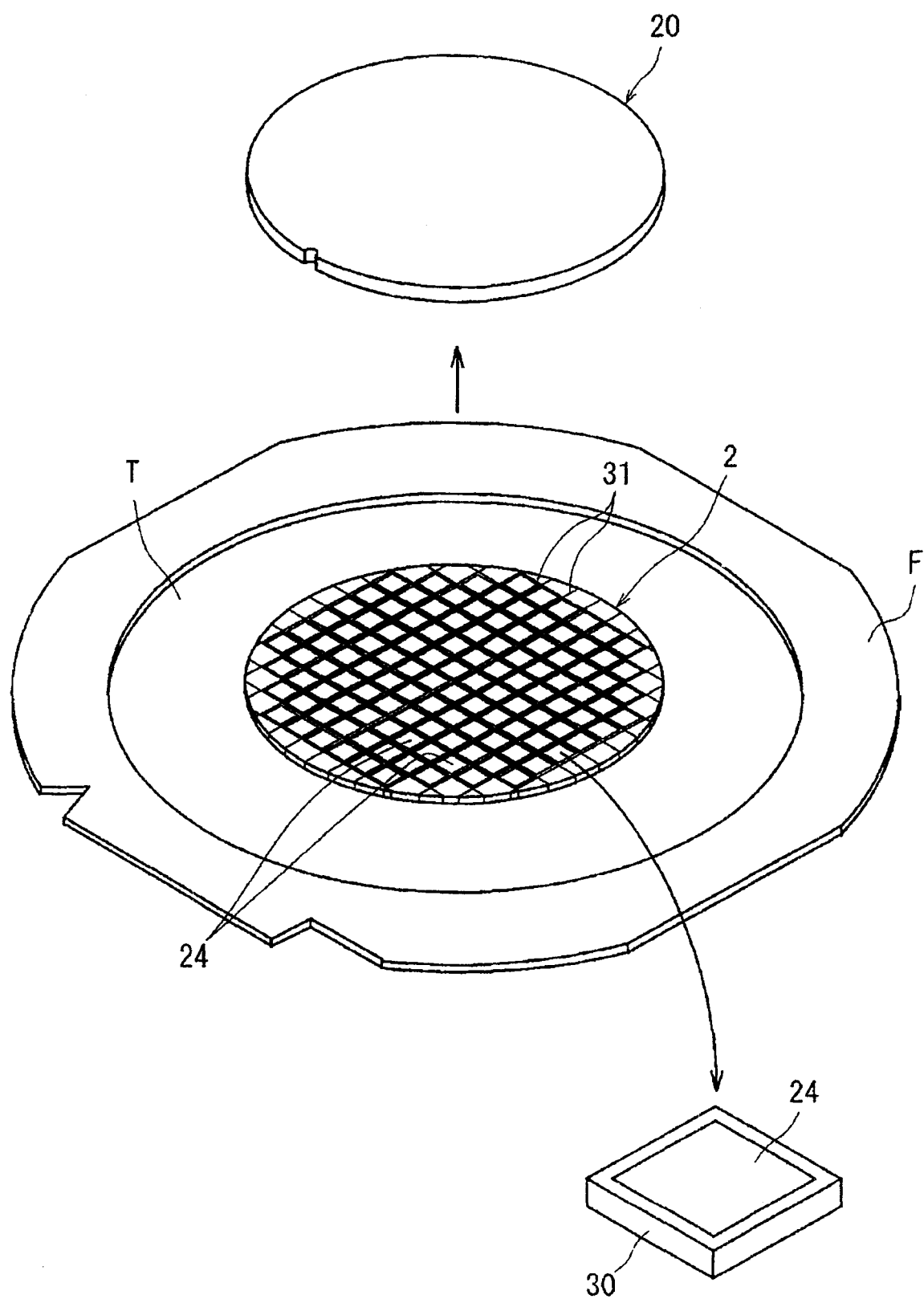
FIG. 10 is a perspective view for illustrating an epitaxy substrate peeling step in the optical device wafer processing method according to the present invention.

After performing the peeling laser beam applying step described above, an epitaxy substrate peeling step is performed in such a manner that the epitaxy substrate 20 is peeled off from the optical device layer 21. More specifically, by performing the peeling laser beam applying step, the binding function of the buffer layer 22 binding the epitaxy substrate 20 and the optical device layer 21 is lost. Accordingly, the epitaxy substrate 20 can be easily peeled off from the optical device layer 21 as shown in FIG. 10. By performing the transfer substrate cutting step, the transfer substrate 3 and the optical device layer 21 are divided along the division grooves 31 into a plurality of pieces 30 respectively corresponding to the individual optical devices 24. Accordingly, by performing the epitaxy substrate peeling step, the plural pieces 30 divided from the transfer substrate 3 attached to the dicing tape T supported to the annular frame F are obtained in the condition that the individual optical devices 24 are respectively bonded to the individual pieces 30 of the transfer substrate 3.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. An optical device wafer processing method for transferring an optical device layer in an optical device wafer to a transfer substrate, said optical device layer being formed on the front side of an epitaxy substrate through a buffer layer, and partitioned by a plurality of crossing streets to define a plurality of regions where optical devices are respectively formed, said optical device wafer processing method comprising:

a transfer substrate bonding step of bonding said transfer substrate to the front side of said optical device layer formed on the front side of said epitaxy substrate through said buffer layer;

a transfer substrate cutting step of cutting said transfer substrate bonded to the front side of said optical device layer together with said optical device layer along said streets, wherein said transfer substrate cutting step results in the formation of a division groove that extends completely through said transfer substrate;

a supporting member attaching step of attaching said transfer substrate to a supporting member after performing said transfer substrate cutting step, wherein the supporting member comprises a dicing tape supported by an annular frame;

a peeling laser beam applying step of applying a laser beam having a transmission wavelength to said epitaxy substrate from the back side of said epitaxy substrate to a unit of said optical device wafer and said transfer substrate in a condition where the focal point of said laser beam is set in said buffer layer, thereby decomposing said buffer layer; and an epitaxy substrate peeling step of peeling off said epitaxy substrate from said optical device layer after performing said peeling laser beam applying step.

2. The optical device wafer processing method according to claim 1, wherein said transfer substrate cutting step comprises the step of cutting said transfer substrate along said streets by using a cutting blade.

3. The optical device wafer processing method according to claim 1, wherein said transfer substrate cutting step comprises the step of cutting said transfer substrate along said streets by applying a laser beam to said transfer substrate along said streets.

4. An optical device wafer processing method for transferring an optical device layer in an optical device wafer to a transfer substrate, said optical device layer being formed on the front side of an epitaxy substrate through a buffer layer, and partitioned by a plurality of crossing streets to define a plurality of regions where optical devices are respectively formed, said optical device wafer processing method comprising:

a transfer substrate bonding step of bonding said transfer substrate to the front side of said optical device layer formed on the front side of said epitaxy substrate through said buffer layer;

a transfer substrate cutting step of cutting said transfer substrate bonded to the front side of said optical device layer together with said optical device layer along said streets, wherein said transfer substrate cutting step does not include fully cutting said epitaxy substrate between the front side and a back side thereof;

a supporting member attaching step of attaching said transfer substrate to a supporting member after performing said transfer substrate cutting step;

a peeling laser beam applying step of applying a laser beam having a transmission wavelength to said epitaxy substrate from the back side of said epitaxy substrate to a unit of said optical device wafer and said transfer substrate in a condition where the focal point of said laser beam is set in said buffer layer, thereby decomposing said buffer layer; and an epitaxy substrate peeling step of peeling off said epitaxy substrate from said optical device layer after performing said peeling laser beam applying step.

5. The optical device wafer processing method according to claim 4, wherein said transfer substrate cutting step comprises the step of cutting said transfer substrate along said streets by using a cutting blade.

6. The optical device wafer processing method according to claim 4, wherein said transfer substrate cutting step comprises the step of cutting said transfer substrate along said streets by applying a laser beam to said transfer substrate along said streets.

* * * * *